United States Patent
Besser et al.

(10) Patent No.: US 9,202,758 B1
(45) Date of Patent: Dec. 1, 2015

(54) METHOD FOR MANUFACTURING A CONTACT FOR A SEMICONDUCTOR COMPONENT AND RELATED STRUCTURE

(75) Inventors: Paul R. Besser, Sunnyvale, CA (US); Minh Van Ngo, Fremont, CA (US); Connie Pin-Chin Wang, Mountain View, CA (US); Jinsong Yin, Sunnyvale, CA (US); Hieu T. Pham, Milpitas, CA (US)

(73) Assignees: GLOBALFOUNDRIES Inc., Grand Cayman (KY); Cypress Semiconductor Corporation, San Jose, CA (US)

( * ) Notice: Subject to any disclaimer, the term of this patent is extended or adjusted under 35 U.S.C. 154(b) by 1689 days.

(21) Appl. No.: 11/109,965

(22) Filed: Apr. 19, 2005

(51) Int. Cl.
  *H01L 21/8234* (2006.01)
  *H01L 29/49* (2006.01)
(52) U.S. Cl.
  CPC .... H01L 21/823418 (2013.01); H01L 29/4975 (2013.01)
(58) Field of Classification Search
  CPC ............... H01L 21/28518; H01L 21/823418; H01L 29/4975
  USPC .......................... 438/424, 270, 622, 633, 637
  See application file for complete search history.

(56) References Cited

U.S. PATENT DOCUMENTS

| | | | | |
|---|---|---|---|---|
| 5,047,367 A | * | 9/1991 | Wei et al. | 438/607 |
| 5,610,099 A | * | 3/1997 | Stevens et al. | 438/626 |
| 5,904,566 A | * | 5/1999 | Tao et al. | 438/689 |
| 5,924,004 A | * | 7/1999 | Hsu | 438/622 |
| 6,001,726 A | * | 12/1999 | Nagabushnam et al. | 438/618 |
| 6,037,220 A | * | 3/2000 | Chien et al. | 438/255 |
| 6,090,725 A | * | 7/2000 | Yang et al. | 438/784 |
| 6,100,202 A | * | 8/2000 | Lin et al. | 438/734 |
| 6,136,693 A | * | 10/2000 | Chan et al. | 438/633 |
| 6,197,658 B1 | * | 3/2001 | Jang | 438/424 |
| 6,251,802 B1 | * | 6/2001 | Moore et al. | 438/778 |
| 6,284,316 B1 | * | 9/2001 | Sandhu et al. | 427/96.8 |
| 6,342,446 B1 | * | 1/2002 | Smith et al. | 438/687 |
| 6,368,952 B1 | * | 4/2002 | Liang et al. | 438/622 |
| 6,417,071 B2 | * | 7/2002 | Jang | 438/424 |
| 6,426,558 B1 | * | 7/2002 | Chapple-Sokol et al. | 257/758 |

(Continued)

OTHER PUBLICATIONS

Novellus Systems, Inc., Novellus Launches Atlus Directfill Tungsten Nitride/Tungsten Deposition System for 65 NM and Below, Nov. 24, 2004, p. 1.*

(Continued)

*Primary Examiner* — Joseph C Nicely
(74) *Attorney, Agent, or Firm* — Farjami & Farjami LLP

(57) ABSTRACT

A semiconductor component and a method for manufacturing the semiconductor component that are suitable for use with low temperature processing. A semiconductor substrate is provided and an optional layer of silicon nitride is formed on the semiconductor substrate using Atomic Layer Deposition (ALD). A layer of dielectric material is formed on the silicon nitride layer using Sub-Atmospheric Chemical Vapor Deposition (SACVD) at a temperature below about 450° C. When the optional layer of silicon nitride is not present, the SACVD dielectric material is formed on the semiconductor substrate. A contact hole having sidewalls is formed through the SACVD dielectric layer, through the silicon nitride layer, and exposes a portion of the semiconductor substrate. A layer of tungsten nitride is formed on the exposed portion of the semiconductor substrate and along the sidewalls of the contact hole. Tungsten is formed on the layer of tungsten nitride.

9 Claims, 2 Drawing Sheets

(56) References Cited

U.S. PATENT DOCUMENTS

| | | | |
|---|---|---|---|
| 6,479,385 B1* | 11/2002 | Jang et al. | 438/691 |
| 6,635,965 B1 | 10/2003 | Lee et al. | |
| 6,987,073 B2* | 1/2006 | Mercaldi | 438/791 |
| 7,078,296 B2* | 7/2006 | Chau et al. | 438/270 |
| 7,189,641 B2* | 3/2007 | Lee et al. | 438/637 |
| 7,319,065 B1* | 1/2008 | Yu et al. | 438/622 |
| 2001/0000012 A1* | 3/2001 | Andideh | 257/760 |
| 2002/0045309 A1* | 4/2002 | Yoshida et al. | 438/240 |
| 2002/0086111 A1 | 7/2002 | Byun et al. | |
| 2003/0003714 A1* | 1/2003 | Lee et al. | 438/636 |
| 2003/0049931 A1 | 3/2003 | Byun et al. | |
| 2003/0073308 A1* | 4/2003 | Mercaldi | 438/680 |
| 2003/0082910 A1 | 5/2003 | Walsh | |
| 2003/0132480 A1* | 7/2003 | Chau et al. | 257/332 |
| 2003/0232495 A1* | 12/2003 | Moghadam et al. | 438/623 |
| 2004/0046258 A1* | 3/2004 | Cronin et al. | 257/758 |
| 2004/0094838 A1* | 5/2004 | Seo et al. | 257/750 |
| 2004/0127017 A1 | 7/2004 | Jung et al. | |
| 2004/0142557 A1 | 7/2004 | Levy et al. | |
| 2004/0166695 A1* | 8/2004 | Yuan et al. | 438/788 |
| 2004/0202786 A1 | 10/2004 | Wongsenakhum et al. | |
| 2005/0000431 A1 | 1/2005 | Elers | |
| 2005/0009325 A1 | 1/2005 | Chung et al. | |
| 2005/0012119 A1* | 1/2005 | Herner et al. | 257/230 |
| 2005/0023516 A1 | 2/2005 | Chopra | |
| 2005/0031786 A1 | 2/2005 | Lee et al. | |
| 2005/0035409 A1 | 2/2005 | Ko et al. | |
| 2005/0035460 A1* | 2/2005 | Tseng | 257/760 |
| 2005/0046028 A1 | 3/2005 | Jung | |
| 2005/0064721 A1* | 3/2005 | Tsai et al. | 438/740 |
| 2005/0095779 A1* | 5/2005 | Park et al. | 438/238 |
| 2005/0142849 A1* | 6/2005 | Oh | 438/624 |
| 2005/0151262 A1* | 7/2005 | Tamaru et al. | 257/758 |
| 2005/0224986 A1* | 10/2005 | Tseng et al. | 257/762 |
| 2005/0236663 A1* | 10/2005 | Pawlak | 257/330 |
| 2005/0260411 A1* | 11/2005 | Ravi | 428/408 |
| 2005/0260810 A1* | 11/2005 | Cheng et al. | 438/199 |
| 2005/0266684 A1* | 12/2005 | Lee et al. | 438/653 |
| 2006/0051959 A1* | 3/2006 | Iwatake et al. | 438/643 |
| 2006/0084247 A1* | 4/2006 | Liu | 438/510 |
| 2006/0099729 A1* | 5/2006 | Yang | 438/40 |
| 2006/0108609 A1* | 5/2006 | Engel et al. | 257/213 |
| 2006/0281249 A1* | 12/2006 | Yilmaz et al. | 438/243 |
| 2007/0015339 A1* | 1/2007 | Sandhu | 438/424 |

OTHER PUBLICATIONS

Novellus Ships 100$^{th}$ ALTUS® PNL™ Module for Tungsten Deposition, 300-mm Tool destined for major Korean DRAM production fab, Sep. 23, 2004, Novellus Press Release, pp. 1-2.

Novellus Launches ALTUS® Directfill™ Tungsten Nitride/Tungsten Deposition System for 65 NM and Below, Breakthrough single-platform architecture for advanced contact and via-fill improves device performance; cuts overall CoO; Nov. 24, 2004, Novellus Press Release, pp. 1-2.

* cited by examiner

METHOD FOR MANUFACTURING A CONTACT FOR A SEMICONDUCTOR COMPONENT AND RELATED STRUCTURE

FIELD OF THE INVENTION

The present invention relates, in general, to a metallization system suitable for use in a semiconductor component and, more particularly, to a metallization system comprising tungsten.

BACKGROUND OF THE INVENTION

Semiconductor component manufacturers are constantly striving to increase the speeds of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. Typically, the metallization system is coupled to the semiconductor substrate through a metal contact.

A figure of merit describing the delay of the metallization system is its Resistance-Capacitance (RC) delay. The RC delay can be derived from the resistance of the metal layer and the associated capacitance within and between different layers of metal in the metallization system. Included in the resistance component of the metallization system is the contact resistance between the metal contact and the semiconductor substrate. The metal may directly contact the semiconductor substrate or it may be coupled to the semiconductor substrate through a metal silicide layer. Many types of metal can be used for the contact. Typical metals include titanium, tantalum, tungsten, cobalt, nickel, copper, aluminum, or the like. When the metal is tungsten, a titanium liner is formed on the semiconductor material or the silicide, a titanium nitride barrier layer is formed over the titanium liner, and the tungsten is formed on the titanium nitride layer. The titanium liner lowers the contact resistance between the semiconductor substrate and the tungsten due to the formation of titanium silicide (TiSi). However, processing steps involving titanium silicide typically exceed 600 degrees Celsius (° C.), which limits the types of materials that can be used in forming semiconductor components. Another drawback with the conventional tungsten contact process is that the titanium liner and titanium nitride barrier layers involve sophisticated processing steps with low throughputs, which increase the cost of manufacturing the semiconductor component.

Accordingly, it would be advantageous to have a method for manufacturing a tungsten contact that allows processing at lower temperatures. It would be of further advantage for the method to be cost and time efficient.

SUMMARY OF THE INVENTION

The present invention satisfies the foregoing need by providing a method for manufacturing the semiconductor component having a tungsten contact. In accordance with one embodiment, the present invention includes a method for manufacturing a semiconductor component comprising providing a semiconductor material and forming a layer of dielectric material over the semiconductor material using Sub-Atmospheric Chemical Vapor Deposition (SACVD). A contact hole having sidewalls is formed in the layer of dielectric material. The contact hole exposes a portion of the semiconductor material. A layer of tungsten nitride is formed in the opening.

In accordance with another embodiment, the present invention includes a method for manufacturing a contact for use in a semiconductor component comprising forming a layer of dielectric material over a surface using Sub-Atmospheric Chemical Vapor Deposition (SACVD). A contact opening is formed in the layer of dielectric material wherein the contact opening exposes a portion of the surface.

In accordance with yet another embodiment, the present invention includes a semiconductor component comprising a semiconductor substrate having a Sub-Atmospheric Chemical Vapor Deposition (SACVD) dielectric material disposed thereover. A contact opening is formed in the SACVD dielectric material and a barrier material is disposed in the contact opening. A metal is disposed on the barrier material.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a method for manufacturing a semiconductor component having a tungsten-based contact metallization system at temperatures of less than about 450° C. In accordance with one aspect of the present invention, contact openings are formed in a dielectric material that is deposited using a Sub-Atmospheric Chemical Vapor Deposition (SACVD) process in which ozone serves as a carrier gas and doped silicate serves as the dielectric material. This dielectric material is void-free, has a low dielectric constant, i.e., it is a low-K dielectric, is mechanically stable, and is capable of filling very narrow recesses or openings. In accordance with another aspect of the present invention, the contact metal comprises tungsten nitride and tungsten. A tungsten containing reactant is formed on the silicon to form a tungsten silicon layer or a tungsten silicon nitride layer. Tungsten is then formed on the tungsten silicon layer or the tungsten silicon nitride.

Figure 1:
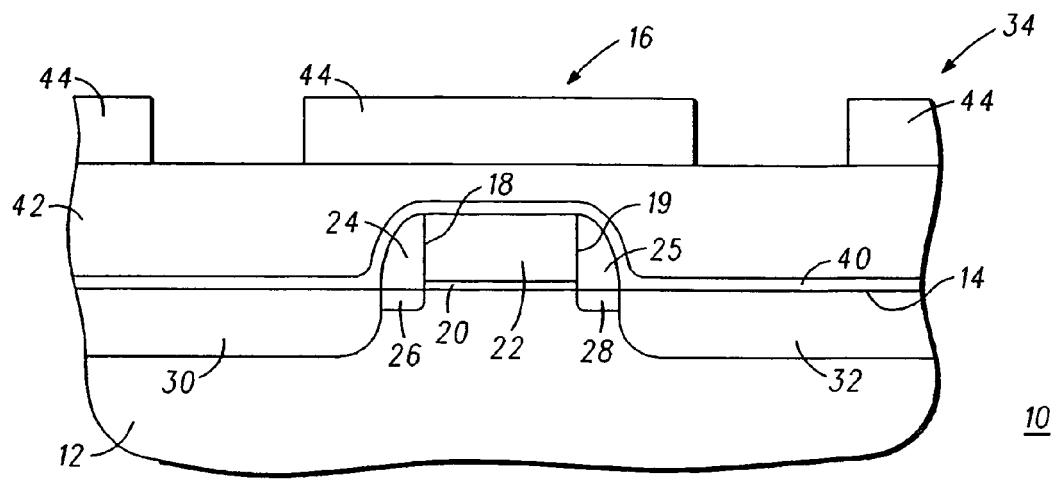
FIG. 1 is a cross-sectional side view of a semiconductor component during manufacture in accordance with an embodiment of the present invention.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 having a major surface 14. It should be understood that the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like. A gate structure 16 having sides 18 and 19 is disposed on a portion of major surface 14. Gate structure 16 comprises a gate dielectric material 20 having a gate conductor 22 disposed thereon. Source and drain extension regions 26 and 28 are aligned to sides 18 and 19 and extend into substrate 12. Spacers 24 and 25 are formed adjacent sides 18 and 19. Source and drain regions 30 and 32, respectively, are formed in the portion of substrate 12 laterally adjacent spacers 24 and 25. Substrate 12, gate structure 16, spacers 24 and 25, source extension region 26, drain extension region 28, source region 30, and drain region 32 cooperate to form a semiconductor device 34. Although semiconductor device 34 is shown and described as a field effect transistor, it should be understood the type of semiconductor device is not a limitation of the present invention. Other suitable semiconductor devices include passive devices such as resistors, capacitors, inductors, and active devices such as junction field effect transistors, bipolar junction transistors, or the like.

Still referring to FIG. 1, a layer of silicon nitride 40 is formed on surface 14, spacers 24 and 25 and gate conductor 22 using atomic layer deposition at a temperature of less than about 450° C. A layer of doped silicate glass 42 is formed on silicon nitride layer 40 using an SACVD process at a temperature of less than about 450° C. In accordance with an embodiment of the present invention, layer 42 is formed in an ozone ambient, i.e., ozone serves as the carrier medium for the phosphosilicate glass. The combination of silicon nitride layer 40 and phosphosilicate glass layer 42 offer processing and performance advantages over typical dielectric layers. Because silicon nitride layer 40 is formed using atomic layer deposition, it can be formed as a thin conformal layer capable of filling narrow gaps. It also decreases the mechanical stresses that arise when a doped silicate glass is formed directly on a semiconductor material. What's more, since it is formed at temperatures of less than about 450° C. it does not damage other structures in semiconductor component 10. The use of ozone as a gaseous carrier medium allows formation of dielectric layer 42 at temperatures of less than about 450° C. which offers the same advantages as low temperature silicon nitride formation.

Although semiconductor component 10 has been shown and described as having a silicon nitride layer 40, it should be understood this is not a limitation of the present invention. In particular, silicon nitride layer 40 is an optional layer that may not be included. A layer of photoresist is disposed on dielectric layer 42 and patterned to form an etch mask 44 that exposes portions of dielectric layer 42.

Figure 2:
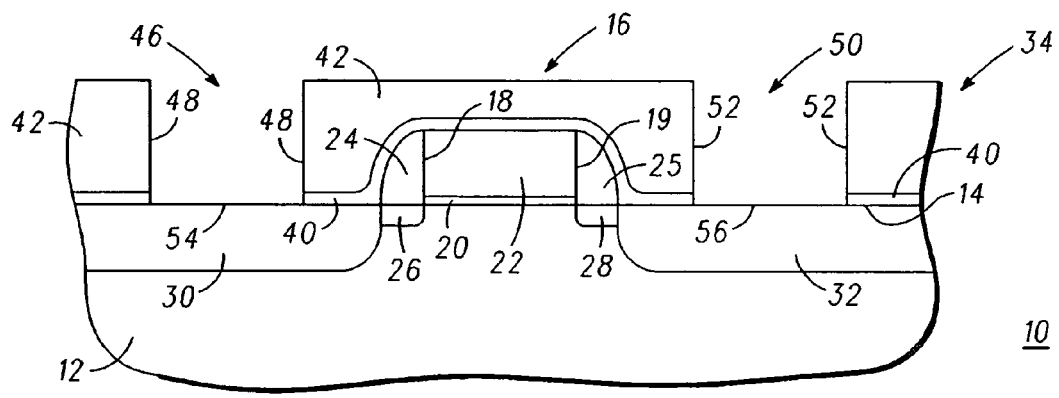
FIG. 2 is a cross-sectional side view of the semiconductor component of FIG. 1 further along in processing.

Referring now to FIG. 2, the exposed portion of dielectric layer 42 and the portion of silicon nitride layer 40 protected by dielectric layer 42 are anisotropically etched using, for example, a reactive ion etch, to form a contact opening or hole 46 having sidewalls 48 and a contact opening or hole 50 having sidewalls 52. Contact opening 46 exposes a portion 54 of semiconductor substrate 12 and contact opening 50 exposes a portion 56 of semiconductor substrate 12. Contact openings 46 and 50 are cleaned using either a wet clean such as, for example, by dipping semiconductor substrate 12 in dilute hydrofluoric acid or by using a plasma dry clean. The clean removes residual oxide or native oxide that may have formed in contact openings 46 and 50. This type of clean is often referred to as a pre-clean.

After the pre-clean, semiconductor substrate 12 is mounted to a wafer receptacle which is transferred to a reaction chamber of a metallization system. The reaction chamber is sealed under vacuum and the pressure in the first chamber is adjusted to range from about 100 milliTorr to about 1 Torr, i.e., from about 13.32 Pascals to about 133.32 Pascals. The temperature within the reaction chamber is adjusted to be in a range from about 100° C. to about 450° C.

Figure 3:
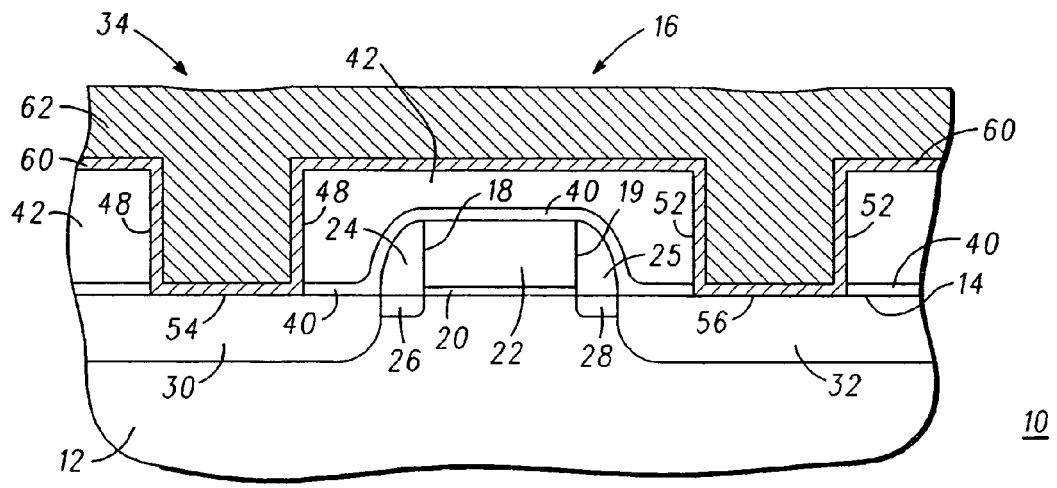
FIG. 3 is a cross-sectional side view of the semiconductor component of FIG. 2 further along in processing.

Referring now to FIG. 3 and in accordance with an embodiment of the present invention, a reaction gas comprising ammonia ($NH_3$) and a reaction gas comprising tungsten hexafluoride ($WF_6$) are injected into the reaction chamber. Preferably, the reaction chamber is maintained at a temperature ranging from about 300° C. to about 450° C. The ammonia reacts with the tungsten hexafluoride to form a tungsten nitride layer 60 which is deposited on portions 54 and 56 of semiconductor material 12, sidewalls 48 and 52, and dielectric layer 42.

Still referring to FIG. 3, a layer of tungsten 62 having a thickness ranging from about 10 Å to about 150 Å is formed on tungsten nitride layer 60 using atomic layer deposition. Layer of tungsten 62 is formed on tungsten layer 60 such that it completely fills openings 46 and 50.

Figure 4:
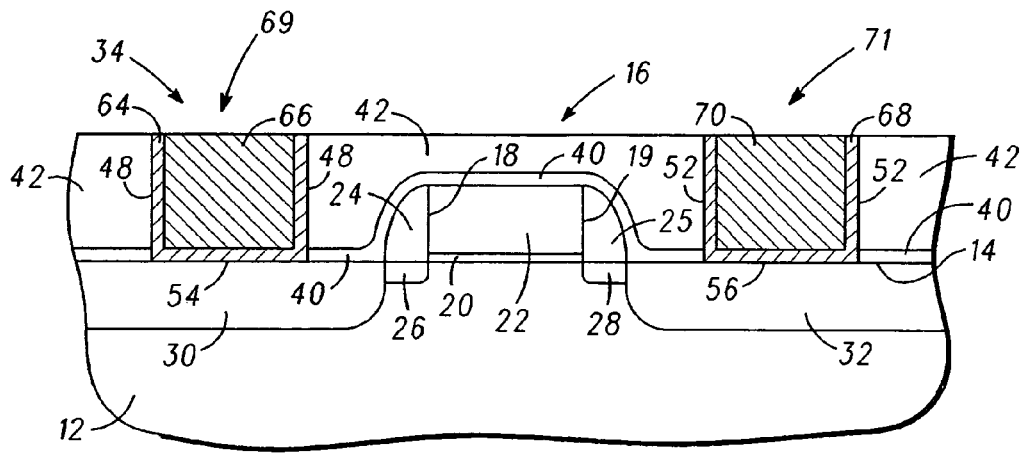
FIG. 4 is a cross-sectional side view of the semiconductor component of FIG. 3 further along in processing.

Referring now to FIG. 4, tungsten layers 62 and 60 are planarized using, for example, a Chemical Mechanical Polishing (CMP) technique having a high selectivity to oxide layer 42. Thus, the planarization stops on oxide layer 42. After planarization, portion 64 of tungsten nitride layer 60 and portion 66 of tungsten layer 62 remain in opening 46, and portion 68 of tungsten nitride layer 60 and portion 70 of tungsten layer 62 remain in opening 50. Portions 64 and 66 cooperate to form a contact 69 and portions 68 and 70 cooperate to form a contact 71. The method for planarizing tungsten layers 62 and 60 is not a limitation of the present invention. Other suitable planarization techniques include electropolishing, electrochemical polishing, chemical polishing, and chemically enhanced planarization.

Figure 5:
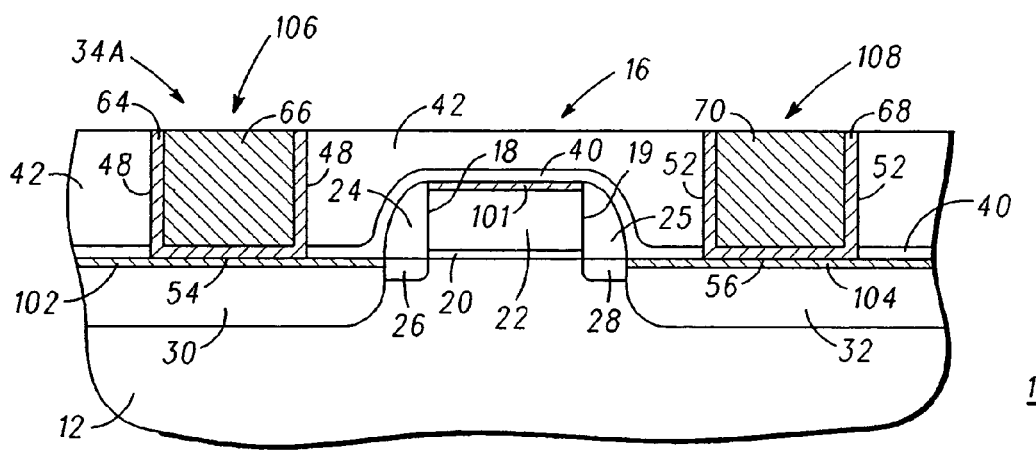
FIG. 5 is a cross-sectional side view of a semiconductor component in accordance with another embodiment of the present invention.

FIG. 5 illustrates a cross-sectional side view of a semiconductor component 100 in accordance with another embodiment of the present invention. Semiconductor component 100 includes substrate 12, gate structure 16, spacers 24 and 25, source extension region 26, source region 28, drain extension region 30, drain region 32, dielectric layers 42 and 40, portions 64 and 66 of layers 60 and 62, respectively, and portions 68 and 70 of layers 60 and 62, respectively. Unlike semiconductor component 10, a silicide layer 101 is formed from gate conductor 22, a silicide layer 102 is formed from source region 30, and a silicide layer 104 is formed from drain region 32. Suitable silicides include nickel silicide, tungsten silicide, titanium silicide, cobalt silicide, and tantalum silicide. Because semiconductor component 100 includes silicide regions 102 and 104, the transistor is identified by reference number 34A rather than reference number 34 as described with reference to semiconductor component 10.

By now it should be appreciated that a semiconductor component having a contact metallization system comprising tungsten and a method for manufacturing the semiconductor component have been provided. In accordance with the present invention, a tungsten contact or plug is formed that contacts either a semiconductor material or silicide. A dielectric material is used in combination with a tungsten metallization scheme that provides small contacts, i.e., less than about 60 nanometers (nm) that can be manufactured at temperatures of less than about 450° C. Because of the low processing temperatures, silicides whose resistance is degraded at temperatures greater than about 450° C. can be used in a contact structure. In addition, the throughput is increased and the cost of manufacturing the semiconductor components is decreased.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a semiconductor material;
    forming a layer of silicon nitride directly on the semiconductor material;
    forming a layer of dielectric material directly on the layer of silicon nitride using Sub-Atmospheric Chemical Vapor Deposition (SACVD), the layer of dielectric material comprising doped silicate glass;
    forming a contact hole in the layer of dielectric material, the contact hole having sidewalls and exposing a portion of the semiconductor material; and
    forming a layer of tungsten nitride in the contact hole and on the exposed portion;
    wherein all processing temperatures for manufacturing the semiconductor component are less than about 450 degrees Celsius;
    wherein forming the layer of dielectric material includes using ozone as a carrier gas.

2. The method of claim 1, wherein the layer of silicon nitride is formed using atomic layer deposition (ALD).

3. The method of claim 2, further including forming the contact hole through the layer of silicon nitride.

4. The method of claim 3, further including forming a layer of tungsten on the layer of tungsten nitride.

5. The method of claim 4, further including cleaning the contact hole before forming the layer of tungsten nitride.

6. The method of claim 1, further including forming a layer of tungsten on the layer of tungsten nitride.

7. The method of claim 1, further including cleaning the contact hole before forming the layer of tungsten nitride.

8. The method of claim 1, further including forming a layer of silicide from a portion of the semiconductor material and wherein forming the contact hole exposes the layer of silicide.

9. The method of claim 8, wherein forming the layer of silicide includes using a silicide selected from the group of silicides consisting of nickel silicide, tungsten silicide, titanium silicide, cobalt silicide, and tantalum silicide.

* * * * *